(12) United States Patent
Woo (10) Patent No.: US 8,729,674 B2
(45) Date of Patent: May 20, 2014

(54) SEMICONDUCTOR DEVICE HAVING A WAFER LEVEL THROUGH SILICON VIA (TSV)

(71) Applicant: SK hynix Inc., Icheon-si (KR)

(72) Inventor: Take Kyun Woo, Suwon-si (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/681,348

(22) Filed: Nov. 19, 2012

(65) Prior Publication Data

US 2014/0061938 A1 Mar. 6, 2014

(30) Foreign Application Priority Data

Aug. 29, 2012 (KR) .................. 10-2012-0094990

(51) Int. Cl.
*H01L 29/40* (2006.01)
*H01L 23/053* (2006.01)
*H01L 23/12* (2006.01)

(52) U.S. Cl.
USPC ............ 257/621; 257/700; 257/E21.585; 257/E21.597; 257/E23.011; 257/E23.174

(58) Field of Classification Search
USPC ............ 257/621, 700, E21.585, E21.597, 257/E23.011, E23.174
See application file for complete search history.

(56) References Cited

U.S. PATENT DOCUMENTS

| 7,846,837 | B2 * | 12/2010 | Kuo ........................... 438/667 |
| 7,932,602 | B2 * | 4/2011 | Katagiri ..................... 257/758 |
| 8,097,964 | B2 * | 1/2012 | West et al. ................. 257/786 |
| 8,247,906 | B2 * | 8/2012 | Law et al. .................. 257/774 |
| 8,264,067 | B2 * | 9/2012 | Law et al. .................. 257/621 |
| 8,338,958 | B2 * | 12/2012 | Nishio et al. .............. 257/774 |
| 8,350,389 | B2 * | 1/2013 | Itaya et al. ................. 257/774 |
| 8,378,495 | B2 * | 2/2013 | West ......................... 257/774 |
| 8,378,496 | B2 * | 2/2013 | Schrank et al. ............ 257/774 |
| 8,501,587 | B2 * | 8/2013 | Chen et al. ................. 438/459 |
| 2011/0084385 | A1 | 4/2011 | Itaya et al. |
| 2011/0298130 | A1 | 12/2011 | Kang |
| 2012/0292777 | A1 * | 11/2012 | Lotz ........................... 257/774 |
| 2013/0020721 | A1 * | 1/2013 | Nakae et al. ............... 257/774 |
| 2013/0037910 | A1 * | 2/2013 | Tzeng et al. ............... 257/532 |
| 2013/0221494 | A1 * | 8/2013 | Ramachandran et al. .... 257/621 |
| 2013/0249011 | A1 * | 9/2013 | Choi et al. ................. 257/369 |
| 2013/0258627 | A1 * | 10/2013 | Guo et al. ................... 361/782 |
| 2014/0016388 | A1 * | 1/2014 | Nishioka et al. ........... 365/51 |

FOREIGN PATENT DOCUMENTS

KR 1020110134198 A 12/2011

* cited by examiner

*Primary Examiner* — Ida M Soward (57) ABSTRACT

A semiconductor device is disclosed allowing detection of a connection state of a Through Silicon Via (TSV) at a wafer level. The semiconductor device includes a first line formed over a Through Silicon Via (TSV), a second line formed over the first line, and a first power line and a second power line formed over the same layer as the second line. Therefore, the semiconductor device can screen not only a chip-to-chip connection state after packaging completion, but also a connection state between the TSV and the chip at a wafer level, so that unnecessary costs and time encountered in packaging of a defective chip are reduced.

13 Claims, 6 Drawing Sheets

SEMICONDUCTOR DEVICE HAVING A WAFER LEVEL THROUGH SILICON VIA (TSV)

CROSS-REFERENCE TO RELATED APPLICATION

The priority of Korean patent application No. 10-2012-0094990 filed on Aug. 29, 2012, the disclosure of which is hereby incorporated in its entirety by reference, is claimed.

BACKGROUND OF THE INVENTION

Embodiments of the present invention relate to a semiconductor device, and more particularly to technology allowing detection of a defective state of a Through Silicon Via (TSV) at a wafer level.

In order to increase an integration degree of a semiconductor device, a three-dimensional (3D) semiconductor device has recently been developed, in which a plurality of chips is stacked and packaged in a single package. The 3D semiconductor device is formed by vertically stacking two or more chips, such that it can acquire a high integration degree in the same space.

Specifically, there has recently been used a Through Silicon Via (TSV) scheme for electrically interconnecting a plurality of chips by allowing a plurality of stacked chips to be penetrated through a silicon via. The semiconductor device using the TSV allows individual chips to be vertically penetrated such that the individual chips are interconnected, so that a package area may be reduced as compared with another semiconductor device configured to interconnect a plurality of chips through a line (or wire) located at an edge.

Figure 1:
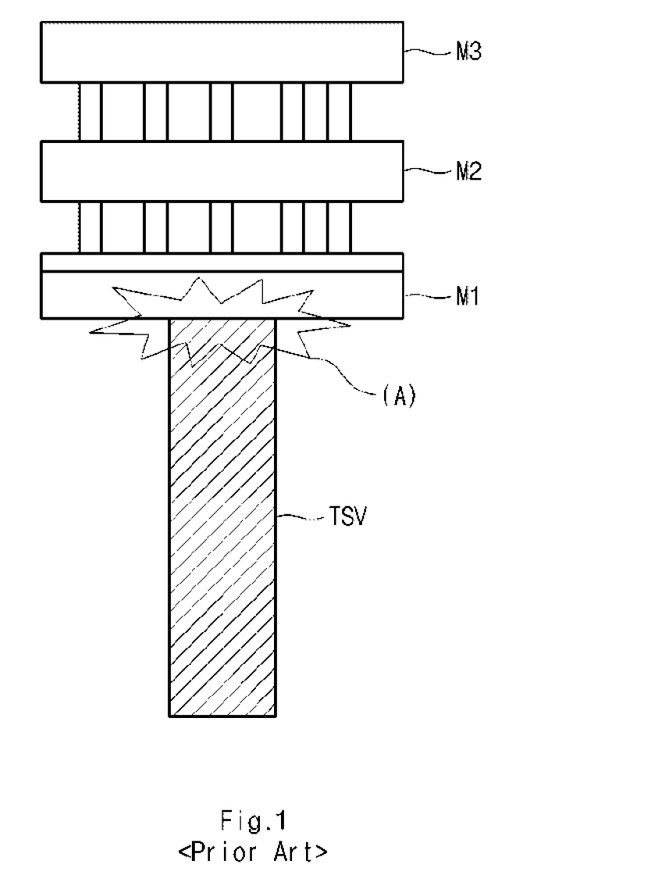
FIG. 1 is a cross-sectional view illustrating a conventional semiconductor device.

FIG. 1 is a cross-sectional view illustrating a conventional semiconductor device.

Referring to FIG. 1, when using the TSV, a plurality of chips having the same structure is stacked so that a single semiconductor device can be configured.

The single semiconductor device may include one master chip for controlling overall operations of the semiconductor device, and a plurality of slave chips for storing data.

In accordance with the semiconductor device shown in FIG. 1, a first metal M1 is formed over a TSV, and a second metal M2 is formed over the first metal M1 through a metal contact.

A third metal M3 is formed over the second metal M2 through the metal contact.

The conventional semiconductor device forms a chip on a wafer, and performs a stacking process upon completion of a dicing process such that it forms a package.

However, the conventional semiconductor device verifies chip-to-chip TSV connection after completion of packaging, such that it is impossible to screen defective TSV connection on a wafer level.

In FIG. 1, the reference number (A) illustrates a defective interface between a TSV and a first metal M1 according to a defective TSV.

Figure 2:
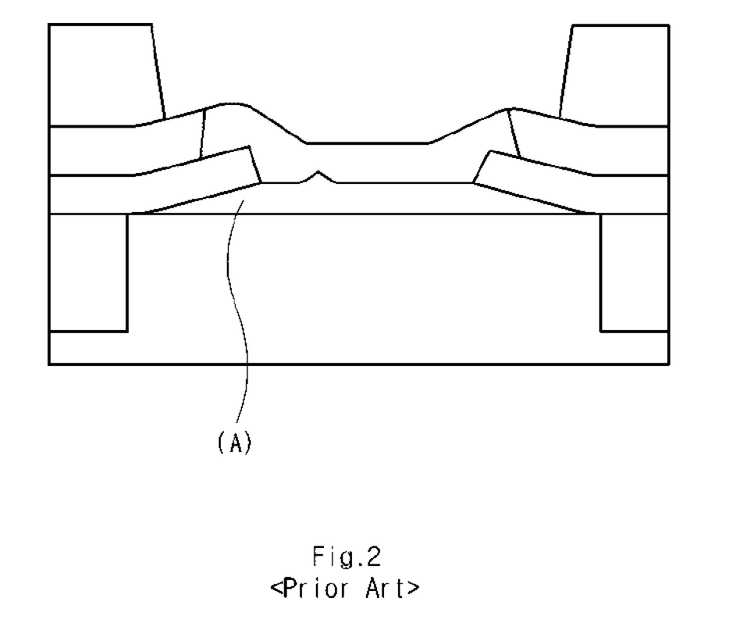
FIG. 2 is a cross-sectional view illustrating the problem encountered in a TSV structure shown in FIG. 1.

FIG. 2 illustrates the problems encountered in a TSV structure shown in FIG. 1.

In the TSV structure for use in a multi-chip package, a copper (Cu) material filled in a TSV is expanded by a subsequent heat process.

Accordingly, a crack occurs by expansion of the Cu material such that a defective interface in which a TSV is not connected to an upper metal pad, occurs as shown in (A).

If a defective part occurs in a TSV pad as shown in (A), a chip-to-chip defective connection occurs during chip stacking.

A defective TSV pad is detected when the wafer is tested such that a fabrication process must be extended to a subsequent package.

However, a defective TSV is not detected when the wafer is tested in a current TSV structure, and a failed TSV operation can be detected only after packaging.

Therefore, unnecessary costs encountered in packaging of a defective material are generated.

Figure 3A:
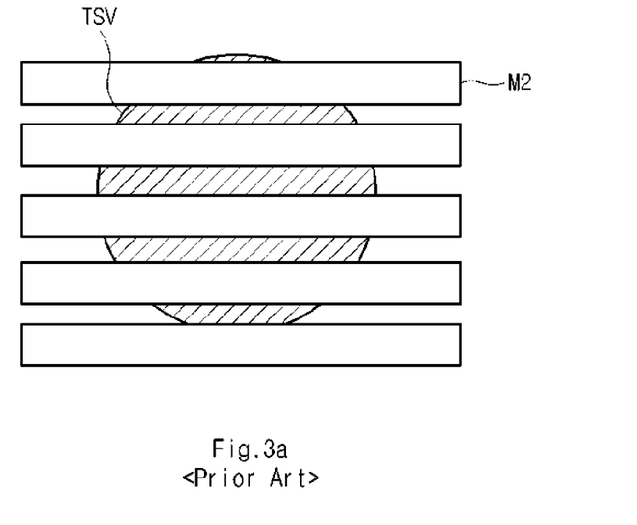
FIGS. 3a and 3b illustrate a defective metal line for use in a TSV structure shown in FIG. 1.
Figure 3B:
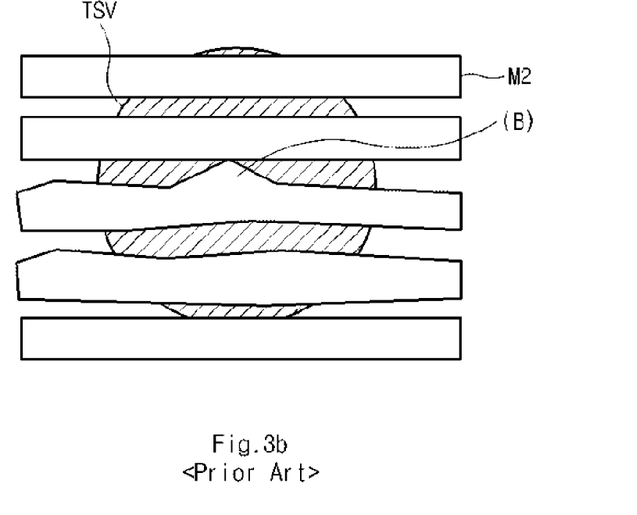

FIGS. 3a and 3b illustrate a defective metal line for use in the TSV structure shown in FIG. 1.

FIG. 3a is a plan view illustrating a second metal line M2 formed over a TSV.

Referring to FIG. 3a, a second metal line M2 is normally formed when a defective TSV does not occur.

On the other hand, FIG. 3b shows a defective interface encountered in a TSV.

Referring to FIG. 3b, a defective second metal line M2 formed over a TSV is unnecessarily connected to a contiguous metal line as shown in (B).

The TSV structure is required for high-speed and high-capacity DRAM operations.

A mid-level structure configured not to consume high costs without great change of an inline fabrication as in a TSV can check its own connectivity after completion of such stacking.

Therefore, when a defective TSV connection occurs in the wafer process, it is difficult for the conventional semiconductor device to screen the defective TSV connection such that unnecessary costs are consumed when packaging of a defective chip.

BRIEF SUMMARY OF THE INVENTION

Various embodiments of the present invention are directed to providing a semiconductor device that substantially obviates one or more problems due to limitations and disadvantages of the related art.

An embodiment relates to a semiconductor device configured to pre-check TSV connectivity, such that unnecessary consumption of costs and time encountered for packaging a defective chip can be reduced.

In accordance with one embodiment, a semiconductor device includes: a first line electrically coupled to a Through Silicon Via (TSV), and formed over the TSV; a second line electrically coupled to the first line, and formed over the first line; and a first power line and a second power line formed over the TSV in a manner that the first and second power lines overlie the TSV.

The first power line and the second power line may be contiguous to each other.

The first power line and the second power line may be electrically coupled to each other when a defective part occurs in the TSV.

The first power line and the second power line may be formed over a same layer as the second line.

The first power line and the second power line may be formed over a center of an upper part of the TSV.

The first power line and the second power line may be configured in the form of a slit.

The first power line and the second power line may be electrically coupled to different power sources.

The first power line may be coupled to a power-supply line.

The second power line may be coupled to a ground-voltage supply line.

The first power line and the second power line may be formed as a line pattern.

The first power line and the second power line may not be electrically coupled to the TSV.

Each of the first power line and the second power line may have the same height as a height of the second line.

Each of the first power line and the second power line may have a smaller critical dimension (CD) than a critical dimension of the second line.

Each of the first line and the second line comprises metal.

The first line and the second line may be electrically coupled to each other through a metal contact.

In accordance with another embodiment, a semiconductor device includes: a first line electrically coupled to a Through Silicon Via (TSV), and formed over the TSV; a second line electrically coupled to the first line, and formed over the first line; a first power line and a second power line formed over the TSV in a manner that the first and second power lines overlie the TSV; and a test unit configured to detect a current flowing between the first power line and the second power line.

The test unit may include a selection unit that selects the first power line and the second power line, and may select a main-chip power source during a normal test mode.

The first power line and the second power line may be electrically coupled to each other when a defective part occurs in the TSV.

It is to be understood that both the foregoing general description and the following detailed description are exemplary and explanatory and are intended to provide further explanation.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 4:
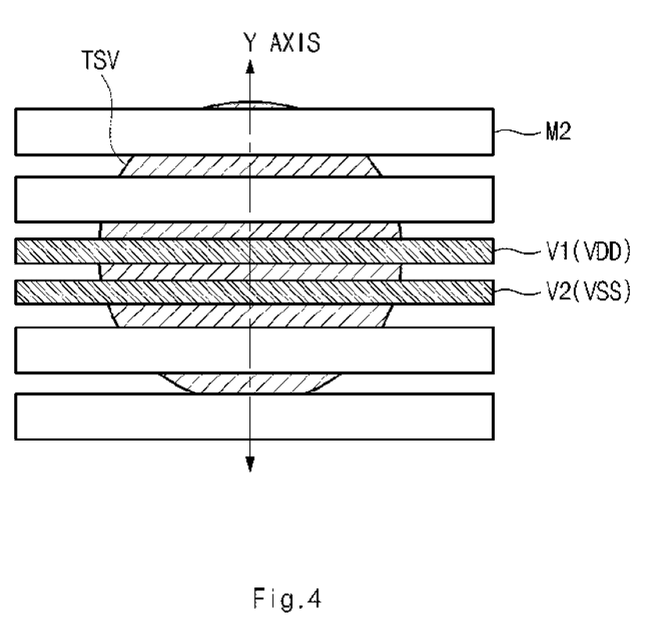
FIG. 4 is a plan view illustrating a semiconductor device according to an embodiment.

FIG. 4 is a plan view illustrating a semiconductor device according to an embodiment of the present invention.

Referring to FIG. 4, a Through Silicon Via (TSV) is formed at the lowest layer of a semiconductor device.

In order to implement a high-capacity and high-speed semiconductor device, a plurality of DRAM chips may be stacked so that chip-to-chip connection and chip-to-sub connection are used.

For this purpose, a TSV is formed as an electrode in a chip such that the resultant TSV passes through a DRAM chip.

In this case, the TSV comprises a low-priced copper (Cu) material having superior conductivity.

A plurality of second metal lines M2 used as a pad, is formed over a TSV.

The plurality of second metal lines M2 has a line-shaped pattern as shown in a plan view.

A first power line V1 and a second power line V2 are formed overlying the center of an upper part of the TSV.

In this case, the first power line V1 and the second power line V2 are adjacent (e.g., contiguous) to each other, and each of the first and second power lines V1 and V2 has a line-shaped pattern.

In addition, the first power line V1 is connected to a power-supply voltage (VDD) line, and the second power line V2 is connected to a ground voltage (VSS) line.

In accordance with an embodiment of the present invention, the first power line V1 has a power-supply voltage (VDD) level, and the second power line V2 has a ground voltage (VSS) level.

However, the scope or spirit of embodiments is not limited thereto, and the first power line V1 may have a high power-supply voltage VCC having a high potential difference, and the second power line V2 may have a ground voltage (GND) or another voltage level.

That is, the higher the potential difference between a power voltage and a ground voltage, the higher the current generated between the first power line V1 and the second power line V2. As a result, the higher the current, the higher the possibility of detecting a defective state.

In addition, the first power line V1 and the second power line V2 are formed between the second metal lines M2 in such a manner that the second metal lines M2 are isolated from each other.

Figure 5:
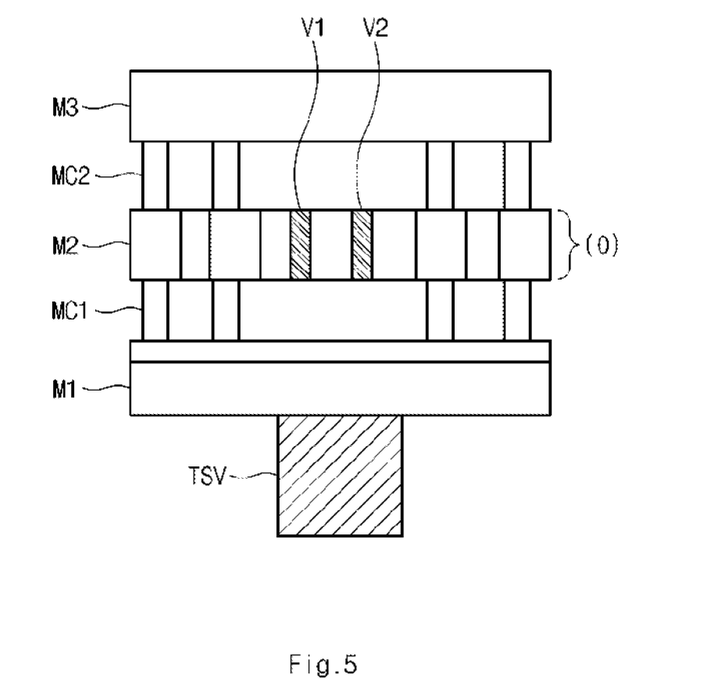
FIG. 5 is a cross-sectional view illustrating a semiconductor device according to an embodiment.

FIG. 5 is a cross-sectional view illustrating a semiconductor device according to an embodiment of the present invention.

In more detail, FIG. 5 is a cross-sectional view illustrating a semiconductor device taken along the direction of a Y-axis shown in FIG. 4.

A first metal line M1 is formed over the TSV of the semiconductor device shown in FIG. 5.

A second metal line M2 connected to a metal contact MC1 is formed over the first metal line M1.

A third metal line M3 connected to a metal contact MC2 is formed over the second metal line M2.

The above-mentioned semiconductor device forms a chip on a wafer, and performs a stacking process upon completion of a dicing process such that it can form a package.

A first power line V1 and a second power line V2 are formed overlying the center part of the second metal line M2.

In this case, the first power line V1 and the second power line V2 are formed on the same layer (O) as the second metal line M2.

The first power line V1 and the second power V2 are formed as a slit as shown in the cross-sectional view of the semiconductor device.

The second metal line M2 is electrically connected to a lower TSV through the metal contact MC1 and the first metal line M1.

However, the first power line V1 and the second power line V2 are not electrically connected to the lower TSV.

Each of the first power line V1 and the second power line V2 has the same height as that of the second metal line M2, and has a smaller critical dimension (CD) than the second metal line M2.

The second metal line M2 that is configured to interconnect a TSV and a chip, is affected by mobility characteristics of copper (Cu).

Therefore, if a defective part occurs in the TSV, a defective interface occurs in the first metal line M1 formed over the TSV.

There arises a defective profile formed over the first metal line M1.

In other words, if a defective part occurs in an interface of the first metal line M1, the surface of an oxide layer (O) formed between the first metal line M1 and the second metal line M2 is not planarized, resulting in formation of an uneven oxide layer.

Therefore, photomasking is inaccurately achieved when the second metal line M2 is formed.

Thus, the pattern of the second metal line M2 is distorted so that the second metal line M2 is not patterned in a desirable manner.

Therefore, a bridge is generated between the first power line V1 and the second power line V2 that are formed over the first metal line M1.

The first power line V1 and the second power line V2 are electrically connected to each other in such a manner that a defective connection occurs.

In this case, the first power line V1 having a power-supply voltage (VDD) level is connected to the second power line V2 having a ground voltage (VSS) level so that a current (IDD) unavoidably occurs.

If a current occurs in the chip by the first power line V1 and the second power line V2 when testing the wafer level, this indicates that a defective part has occurred in the TSV.

In order to allow the defective part generated in the TSV to be applied to the first power line V1 and the second power line V2 in such a manner that a bridge is formed between the first power line V1 and the second power line V2, a specific pattern for forming the first power line V1 and the second power line V2 over the TSV is formed.

Accordingly, embodiments of the present invention can check a chip-to-chip connection state after completion of packaging, and at the same time can verify a connection state between the TSV 100 and the chip even at a wafer level.

The above-mentioned embodiment of the present invention can be applied to a TSV indicating chip-to-chip connection in a manner that a high-capacity and high-speed DRAM can be implemented.

In other words, connection between the TSV and the chip can be checked in a step prior to the packaging step during interconnection of the semiconductor chips.

Figure 6:
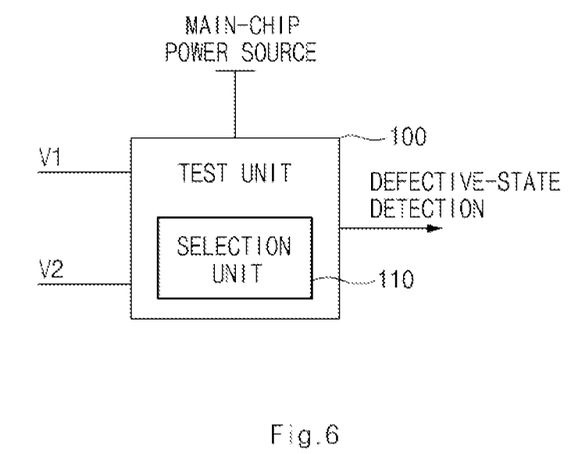
FIG. 6 is a block diagram illustrating a test unit for testing a current flowing in a power line according to an embodiment.

FIG. 6 is a block diagram illustrating a test unit 100 for testing a current flowing in the first or second power line V1 or V2 according to an embodiment of the present invention.

Referring to FIG. 6, provided that a bridge occurs between the first power line V1 and the second power line V2 so that there arises a defective part in which the first power line V1 is connected to the second power line V2, there arises a current caused by electric connection between the first power line V1 and the second power line V2.

The test unit 100 is connected to the first power line V1 and the second power line V2.

The test unit 100 determines whether or not a current occurs between the first power line V1 and the second power line V2, such that it can detect the presence or absence of a defective TSV.

The test unit 100 is connected not only to a main-chip power source, but also to the first and second power lines V1 and V2.

The test unit 100 may select the main-chip power source using the selection unit 110, or may select the first or second power line V1 or V2.

Accordingly, the test unit 100 can determine whether a defective part occurs in the chip or TSV according to the selection result.

In other words, during the TSV test mode, the selection unit 110 prevents connection to the main-chip power source and selects the first power line V1 and the second power line V2.

If connection to the main-chip power source is not prevented in the TSV test mode, it is difficult to separately test a power source for testing the TSV and the main-chip power source may be used as noise.

As a result, connection to the main-chip power source is prevented from the TSV test mode so that the TSV test can be correctly carried out.

Accordingly, embodiments of the present invention can test whether a defective interface occurs in a TSV during the TSV test mode.

On the other hand, during a normal test mode, the selection unit 110 prevents connection between the first power line V1 and the second power line V2 and selects the main-chip power source of the semiconductor device in such a manner that the presence or absence of a defective power source can be recognized.

The selection unit 110 according to an embodiment may be comprised of the switching element.

As is apparent from the above description, the semiconductor device according to the embodiments can screen not only chip-to-chip connectivity, but also connectivity between a TSV and a chip at a wafer level. Thus, unnecessary consumption of costs and time encountered in packaging a defective chip can be reduced.

Those skilled in the art will appreciate that embodiments may be carried out in other specific ways than those set forth herein without departing from the spirit and essential characteristics. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, claims that are not explicitly cited in each other in the appended claims may be presented in combination as an exemplary embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device having a wafer level through silicon via comprising:
    a first line electrically coupled to a Through Silicon Via (TSV), and formed over the TSV;
    a second line electrically coupled to the first line, and formed over the first line; and
    a first power line and a second power line formed over the TSV in a manner that the first and second power lines overlie the TSV, wherein the first power line and the second power line are formed over a same layer as the second line and not electrically coupled to the TSV.

2. The semiconductor device having a wafer level through silicon via according to claim 1, wherein the first power line and the second power line are contiguous to each other.

3. The semiconductor device having a wafer level through silicon via according to claim 1, wherein the first power line and the second power line are electrically coupled to each other when a defective part occurs in the TSV.

4. The semiconductor device having a wafer level through silicon via according to claim 1, wherein the first power line and the second power line are formed over a center of an upper part of the TSV.

5. The semiconductor device having a wafer level through silicon via according to claim 1, wherein the first power line and the second power line are configured in the form of a slit.

6. The semiconductor device having a wafer level through silicon via according to claim 1, wherein the first power line and the second power line are electrically coupled to different power sources.

7. The semiconductor device having a wafer level through silicon via according to claim 6, wherein the first power line is coupled to a power-supply line.

8. The semiconductor device having a wafer level through silicon via according to claim 6, wherein the second power line is coupled to a ground-voltage supply line.

9. The semiconductor device having a wafer level through silicon via according to claim 1, wherein the first power line and the second power line are formed as a line pattern.

10. The semiconductor device having a wafer level through silicon via according to claim 1, wherein each of the first power line and the second power line has a same height as a height of the second line.

11. The semiconductor device having a wafer level through silicon via according to claim 1, wherein each of the first power line and the second power line has a smaller critical dimension (CD) than a critical dimension of the second line.

12. The semiconductor device having a wafer level through silicon via according to claim 1, wherein each of the first line and the second line comprises metal.

13. The semiconductor device having a wafer level through silicon via according to claim 1, wherein the first line and the second line are electrically coupled to each other through a metal contact.

* * * * *